(12) United States Patent
Fujikawa et al.

(10) Patent No.: US 8,048,697 B2
(45) Date of Patent: Nov. 1, 2011

(54) METHOD FOR MANUFACTURING AN LCD DEVICE EMPLOYING A REDUCED NUMBER OF PHOTOMASKS INCLUDING BOTTOM AND TOP GATE TYPE DEVICES

(75) Inventors: Saishi Fujikawa, Kanagawa (JP); Kunio Hosoya, Kanagawa (JP); Yoko Chiba, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/948,834

(22) Filed: Nov. 18, 2010

(65) Prior Publication Data

US 2011/0065221 A1 Mar. 17, 2011

Related U.S. Application Data

(62) Division of application No. 12/254,560, filed on Oct. 20, 2008, now Pat. No. 7,842,528.

(30) Foreign Application Priority Data

Oct. 23, 2007 (JP) .................................. 2007-275782

(51) Int. Cl.
*H01L 21/00* (2006.01)
(52) U.S. Cl. ............ 438/30; 438/155; 438/698; 257/72; 257/E21.415
(58) Field of Classification Search ............ None
See application file for complete search history.

(56) References Cited

U.S. PATENT DOCUMENTS

| | | | |
|---|---|---|---|
| 6,008,065 A | 12/1999 | Lee et al. |
| 6,485,997 B2 | 11/2002 | Lee et al. |
| 6,493,048 B1 | 12/2002 | Baek et al. |
| 6,635,581 B2 | 10/2003 | Wong |
| 7,599,014 B2 | 10/2009 | Shih |
| 2001/0007779 A1 | 7/2001 | Lee et al. |
| 2005/0263768 A1 | 12/2005 | Ahn |
| 2005/0270434 A1 | 12/2005 | Jung et al. |
| 2006/0290867 A1 | 12/2006 | Ahn et al. |
| 2007/0002249 A1 | 1/2007 | Yoo et al. |
| 2007/0126969 A1 | 6/2007 | Kimura et al. |
| 2007/0146591 A1 | 6/2007 | Kimura et al. |
| 2007/0222936 A1 | 9/2007 | Shih |

(Continued)

FOREIGN PATENT DOCUMENTS

JP 2001-053283 A 2/2001

(Continued)

*Primary Examiner* — Thanh V Pham
*Assistant Examiner* — Andres Munoz
(74) *Attorney, Agent, or Firm* — Fish & Richardson P.C.

(57) ABSTRACT

A manufacturing method of the present invention includes a process using a first multi-tone mask, in which a first conductive layer in which a transparent conductive layer and a metal layer are stacked over a substrate, a gate electrode formed of a first conductive layer, and a pixel electrode formed of a single layer of the transparent conductive layer are formed, a process using a second multi-tone mask, in which a contact hole to the pixel electrode, and an island of an i-type semiconductor layer and an $n^+$ type semiconductor layer are formed after a gate insulating film, the i-type semiconductor layer, and the $n^+$ type semiconductor layer are formed, a process using a third photomask, in which a source electrode and a drain electrode are formed after a second conductive layer is formed, and a process using a fourth photomask, in which an opening region is formed after a protective film is deposited.

6 Claims, 14 Drawing Sheets

U.S. PATENT DOCUMENTS

| | | | |
|---|---|---|---|
| 2007/0224547 A1* | 9/2007 | Kido | 430/322 |
| 2007/0272355 A1* | 11/2007 | Kido | 156/345.1 |
| 2008/0299690 A1* | 12/2008 | Hirota | 438/30 |
| 2009/0033818 A1 | 2/2009 | Nakajima et al. | |
| 2009/0101906 A1 | 4/2009 | Hosoya et al. | |
| 2009/0104723 A1 | 4/2009 | Hosoya et al. | |
| 2009/0108260 A1 | 4/2009 | Lin et al. | |
| 2009/0117691 A1 | 5/2009 | Fujikawa et al. | |
| 2009/0148970 A1 | 6/2009 | Hosoya et al. | |

FOREIGN PATENT DOCUMENTS

| | | |
|---|---|---|
| JP | 2001-235763 A | 8/2001 |
| JP | 2007-011340 A | 1/2007 |
| JP | 2007-011343 A | 1/2007 |
| JP | 2007-183583 A | 7/2007 |
| JP | 2007-183585 A | 7/2007 |
| JP | 2007-243144 A | 9/2007 |

* cited by examiner

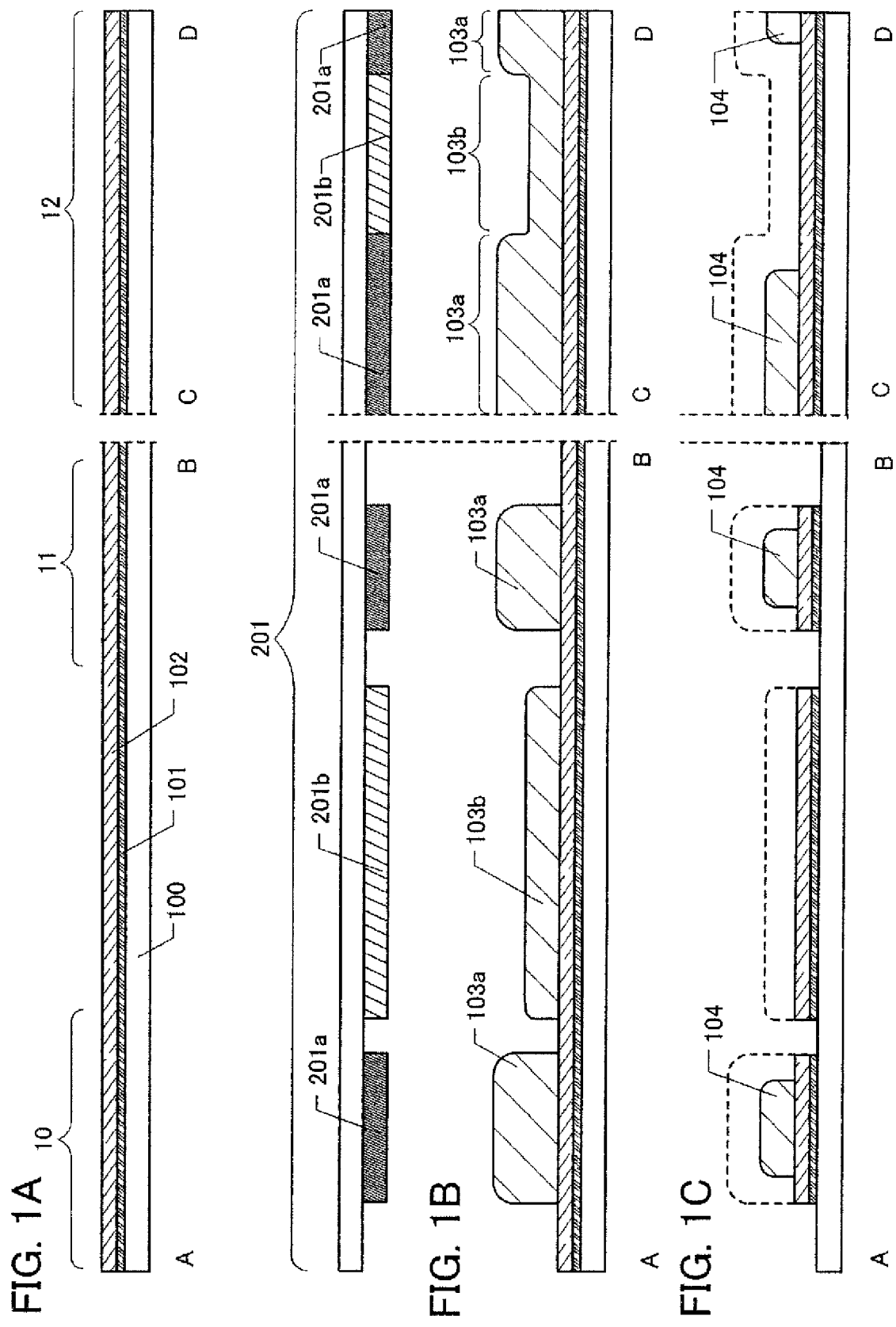

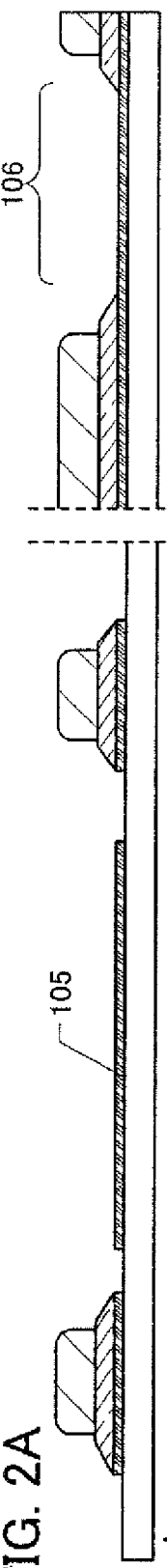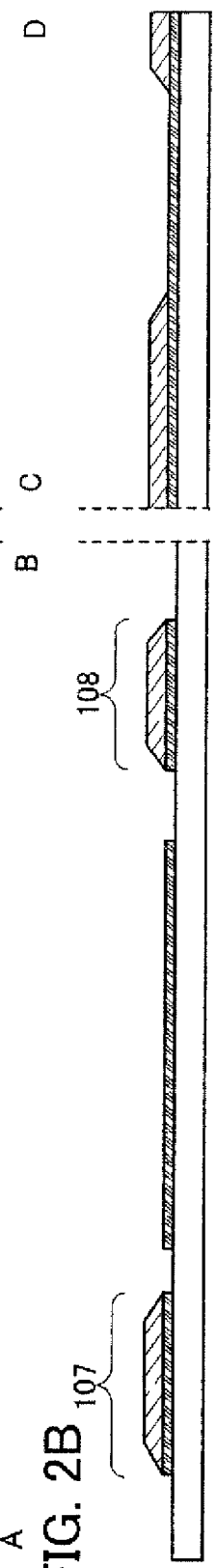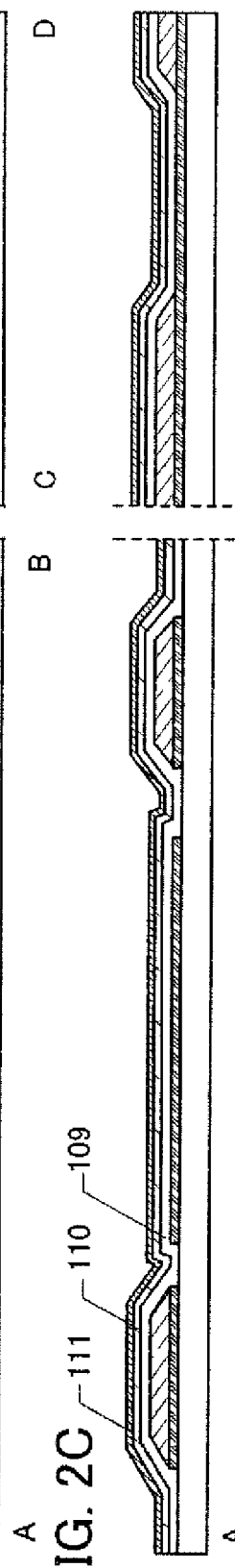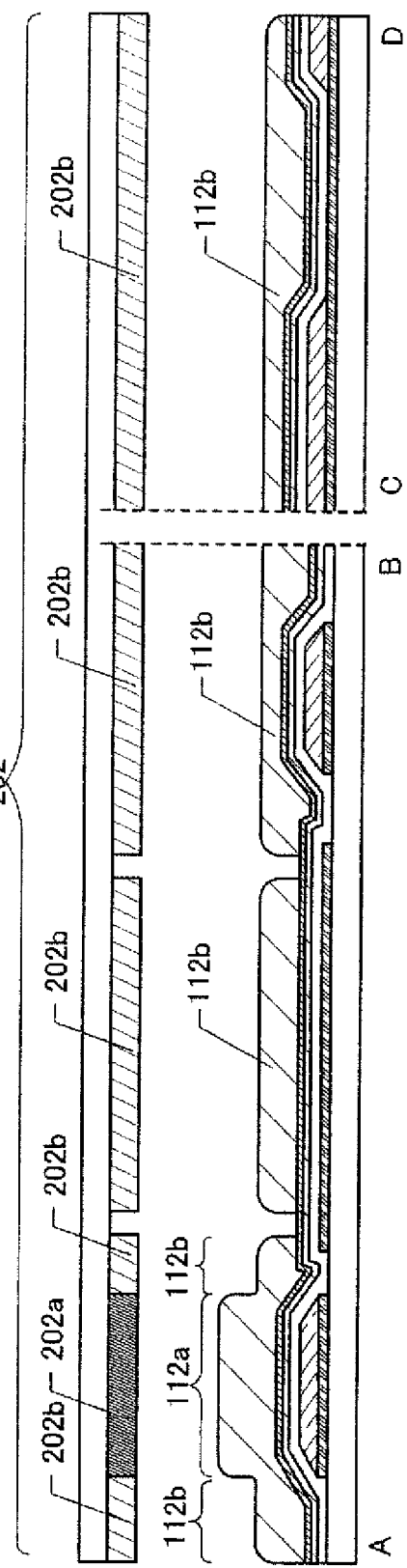

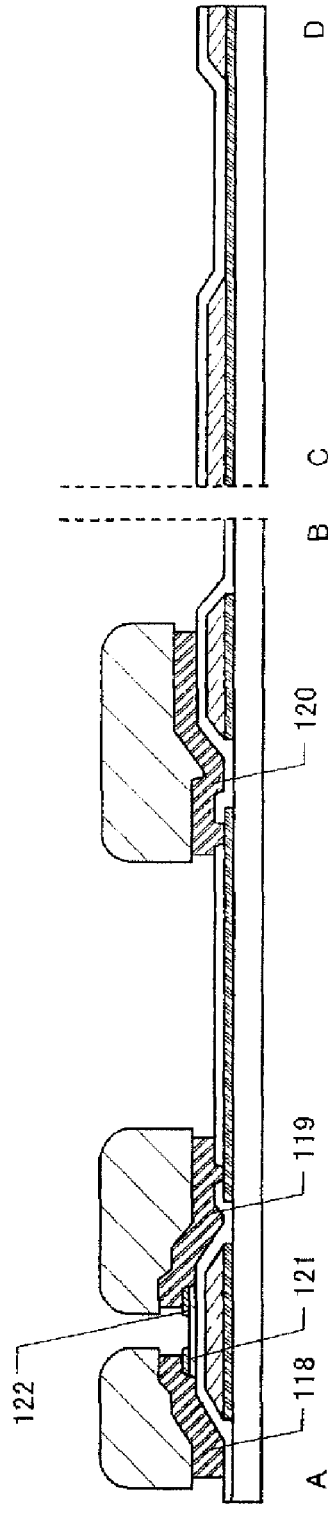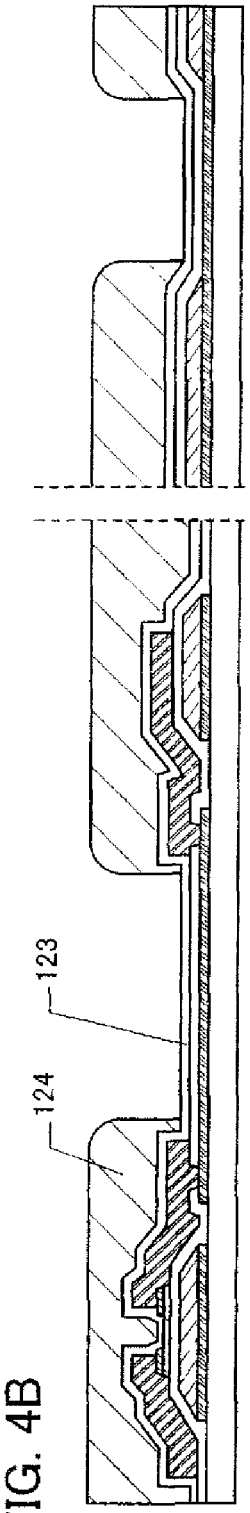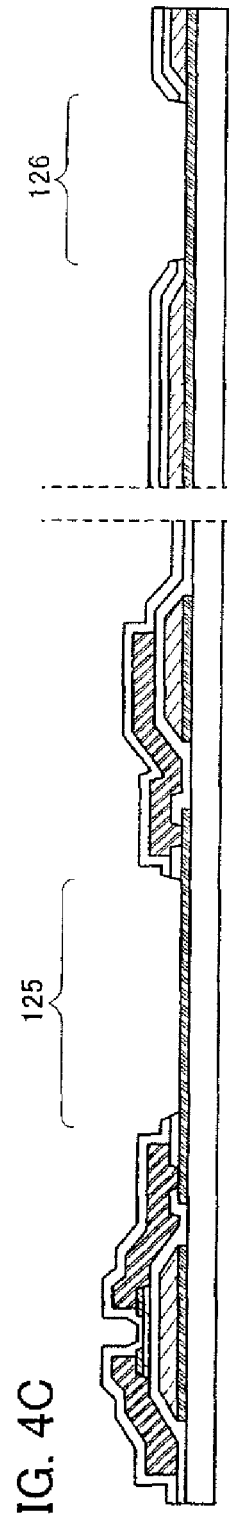

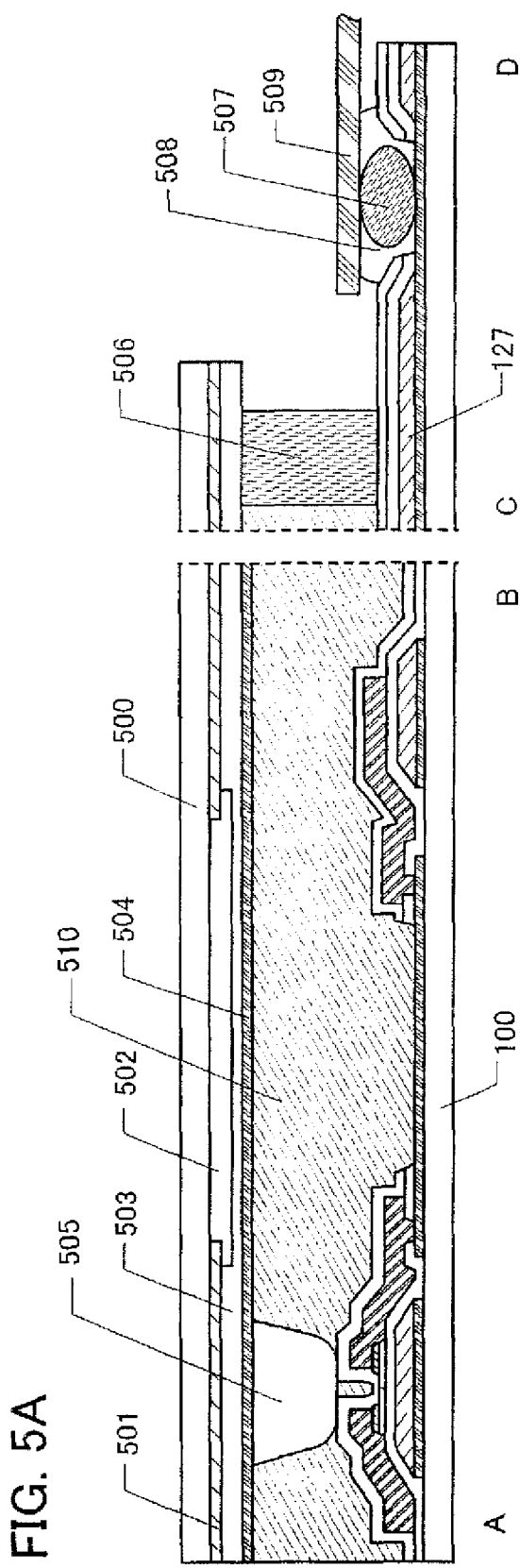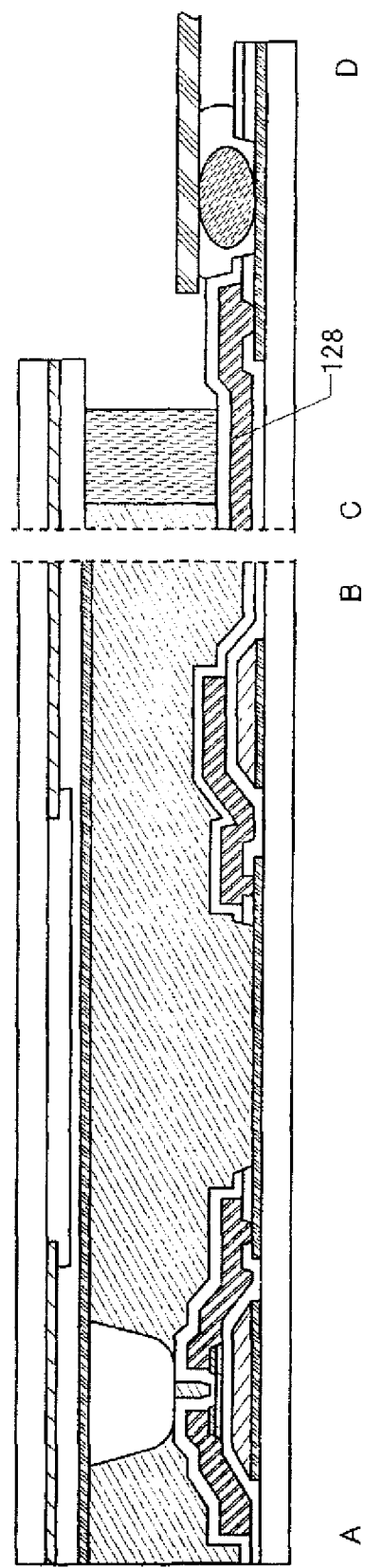

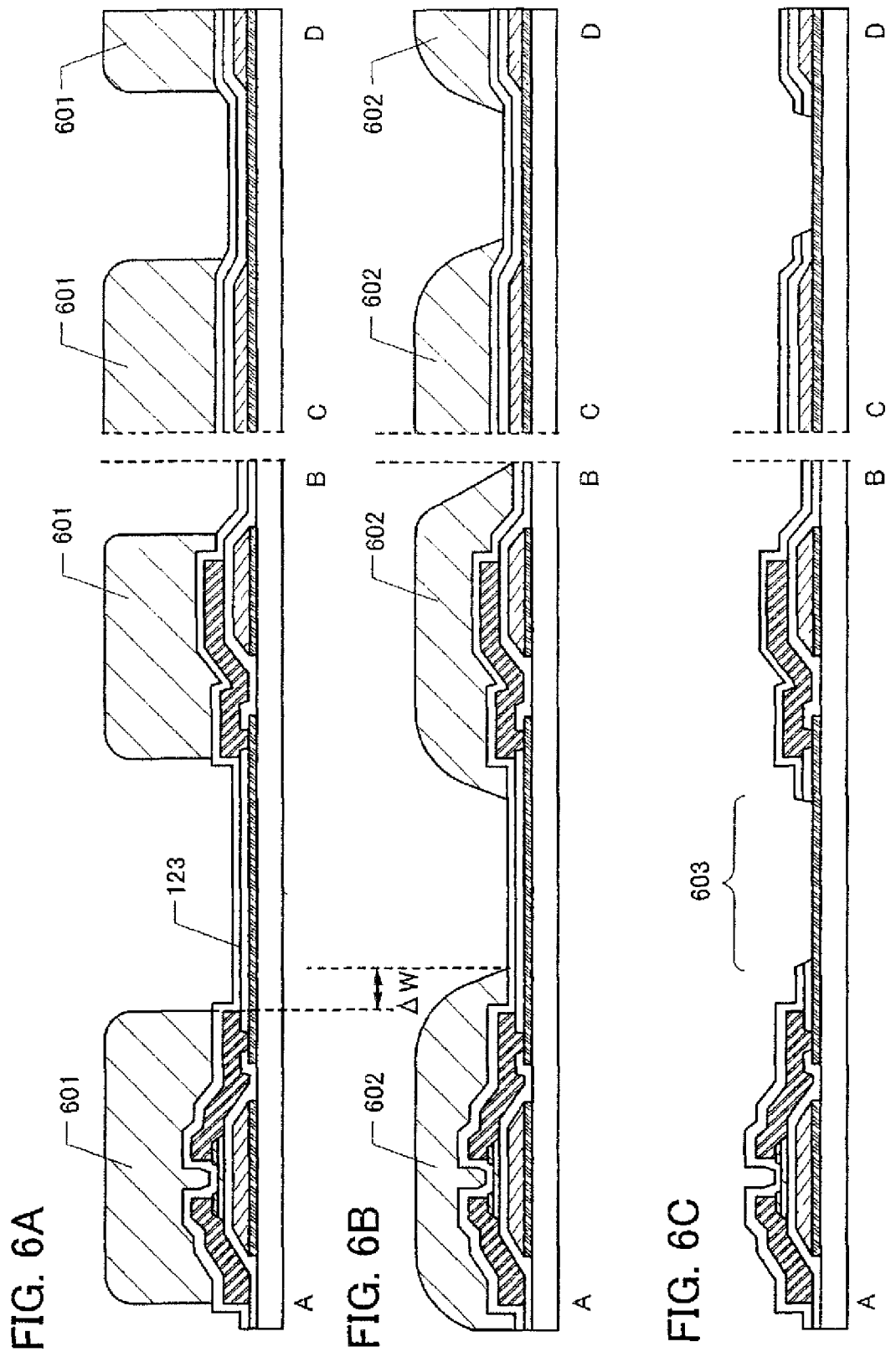

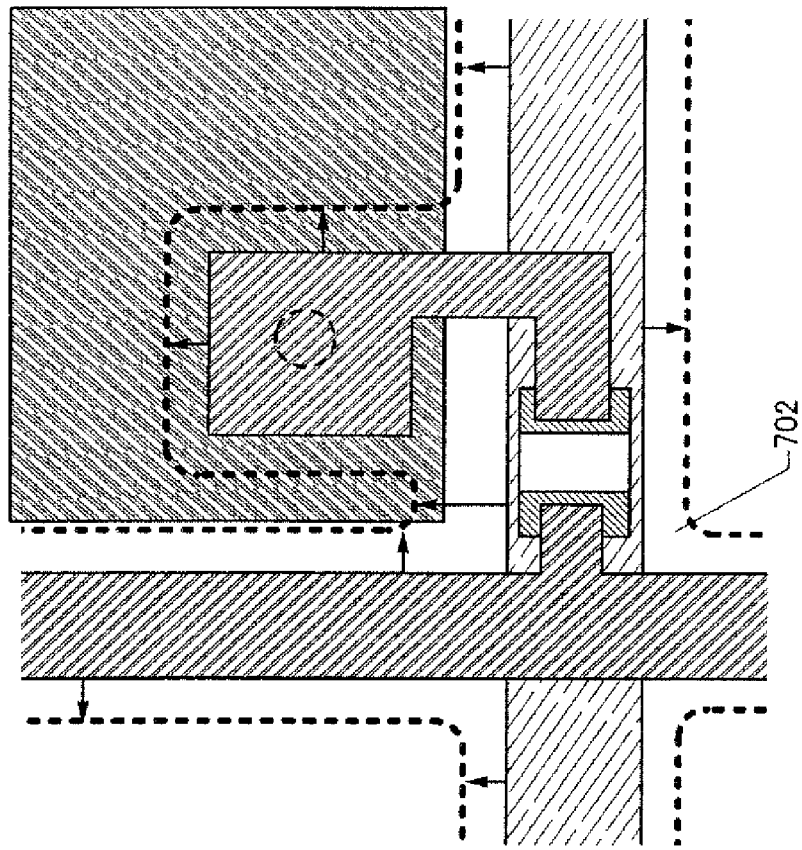
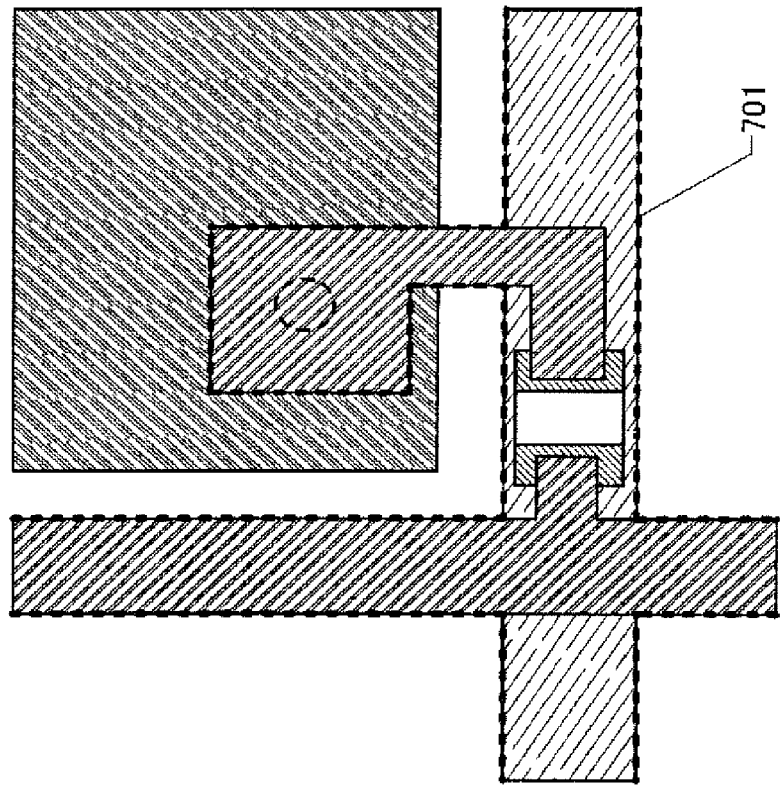
FIG. 7A
FIG. 7B

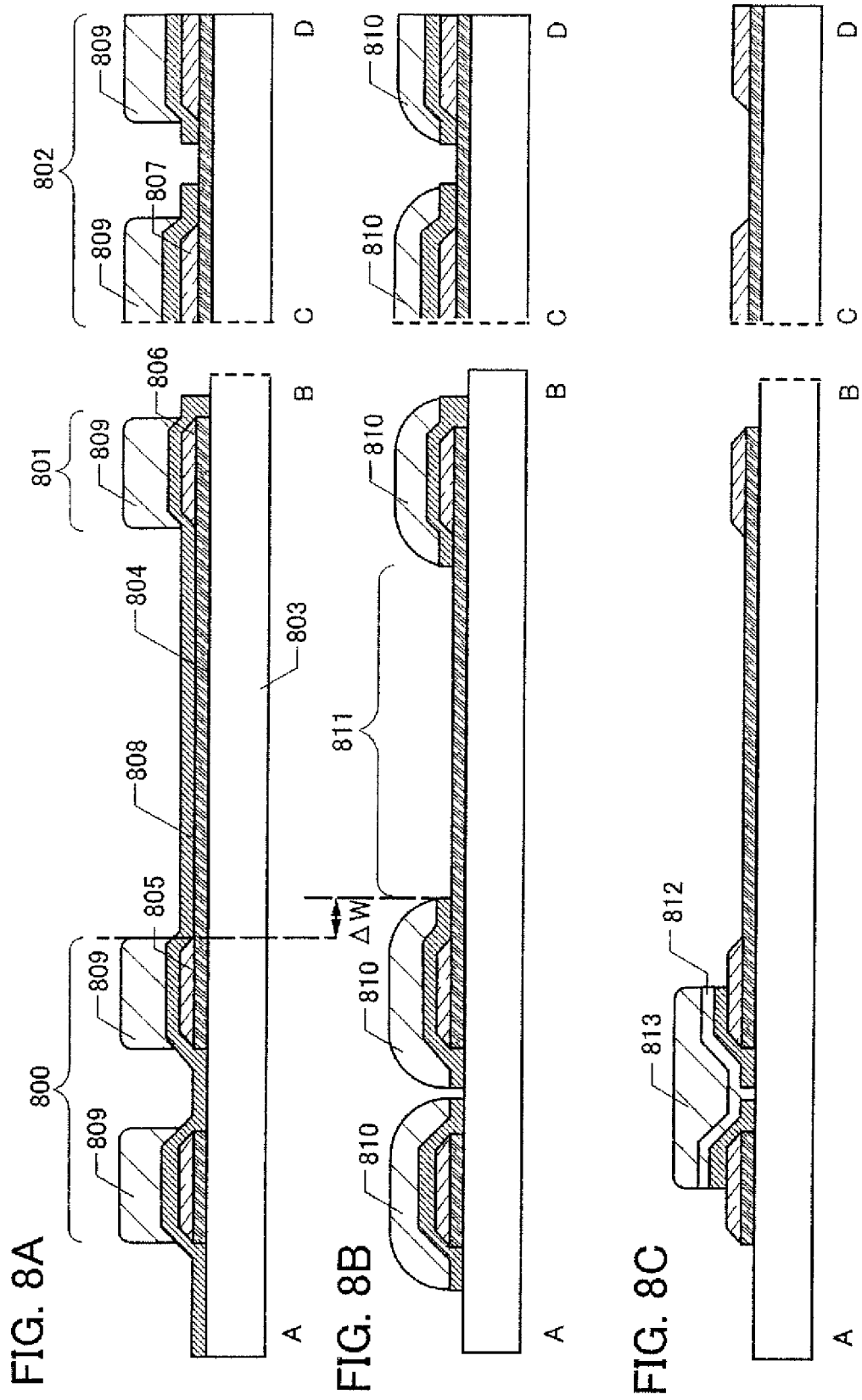

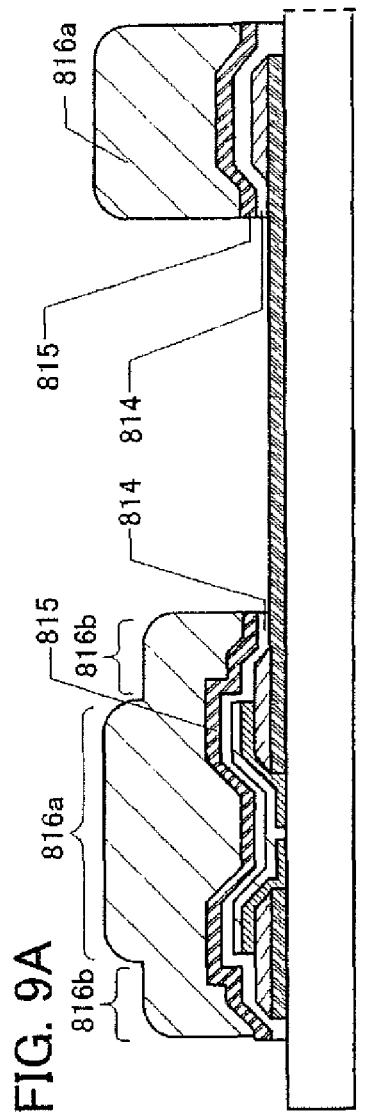
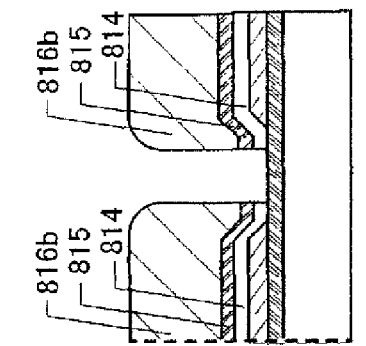
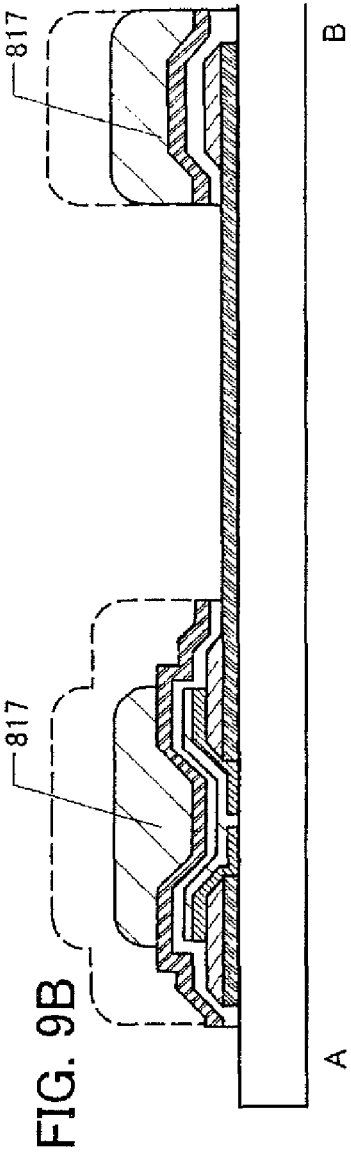
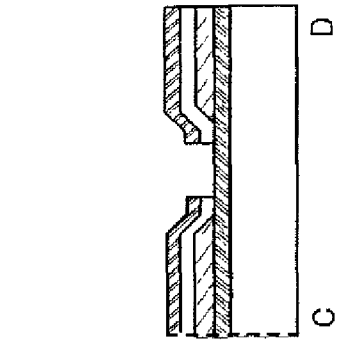
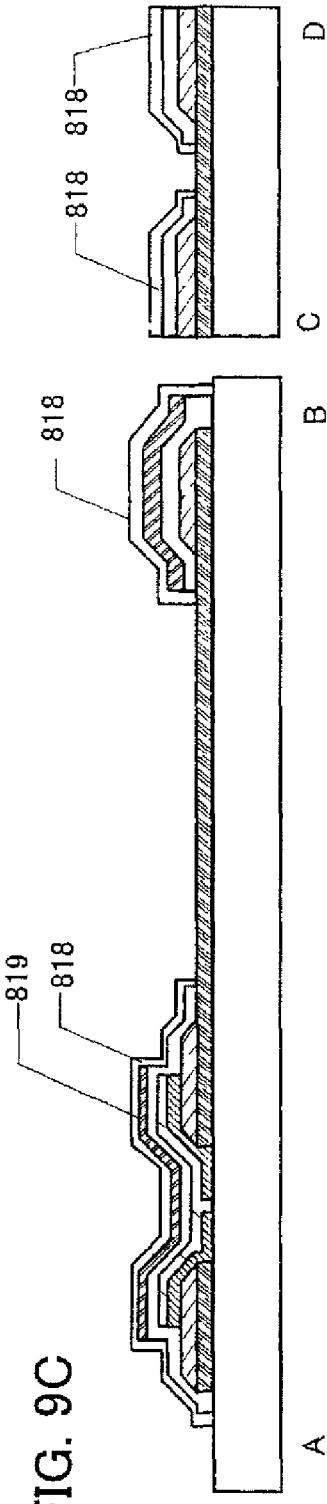
FIG. 9A
FIG. 9B
FIG. 9C

METHOD FOR MANUFACTURING AN LCD DEVICE EMPLOYING A REDUCED NUMBER OF PHOTOMASKS INCLUDING BOTTOM AND TOP GATE TYPE DEVICES

CROSS-REFERENCE TO RELATED APPLICATIONS

This application is a divisional of U.S. application Ser. No. 12/254,560, filed Oct. 20, 2008, now allowed, which claims the benefit of a foreign priority application filed in Japan as Serial No. 2007-275782 on Oct. 23, 2007, both of which are incorporated by reference.

BACKGROUND OF THE INVENTION

1. Field of the Invention

The present invention relates to a semiconductor device which has a circuit including a thin film transistor formed using a semiconductor film, and also relates to a manufacturing method thereof. Further, the present invention relates to a display device and a manufacturing method thereof.

2. Description of the Related Art

Display devices are widely spread as displays of televisions and personal computers, cellular phones, and the like, in many of which a liquid crystal display device which uses a thin film transistor including an amorphous silicon (hereinafter, referred to as an amorphous silicon TFT) as a switching element is used. The amorphous silicon TFT is conventionally formed over a glass substrate by a known photolithography process using five photomasks as disclosed in Patent Document 1.

Five photomasks described here include a first photomask for forming a gate electrode, a second photomask for separating a semiconductor layer, a third photomask for forming a source electrode and a drain electrode, a fourth photomask for providing an opening in a protective insulating film, and a fifth photomask for forming a pixel electrode.

[Patent Document 1] Japanese Published Patent Application No. 2001-53283.

SUMMARY OF THE INVENTION

A photolithography process using photomasks includes an application of photoresist, a prebake, a light exposure process using a photomask, a development process, a rinse process, a postbake process, an etching process, a resist removal process, and the like. In addition, multiple processes, for example, a cleaning process and an inspecting process, are included. Since such multiple processes are needed, a great deal of cost and time is needed to conduct one photolithography process.

Since a liquid crystal display has been improved in resolution and viewing angle, a pixel structure tends to be smaller, and a pattern which forms a pixel tends to be thinner. Accordingly, more advanced precision in a manufacturing process is needed. In particular, as the pattern which is formed using photomasks becomes more precise, a misalignment between photomasks brings larger effect on yield than ever.

The present invention provides a semiconductor device for which can reduce the number of photomasks and a manufacturing method thereof to solve the above-described problems.

The present invention relates to a semiconductor device which is formed using four or three photomasks in total and a backside light exposure technique to reduce the number of processes of conventional five-photomask process and a manufacturing method thereof.

A feature of the present invention is that a stacked layer of a transparent conductive layer and a metal layer is used as a first conductive layer, and the first conductive layer is used as a gate electrode and a pixel electrode by using a first multi-tone mask.

Further, in the present invention, a formation of a contact hole and a processing of a semiconductor layer are conducted by using a second multi-tone mask.

Furthermore, in the present invention, one photomask is eliminated by using a backside light exposure and a reflow technique. Note that a semiconductor device and a manufacturing method thereof of the present invention can be applied to manufacturing an EL display device.

By the present invention, advantageous effects described below can be realized.

By reducing the number of photomasks compared to that in the conventional manufacturing method which uses five photomasks, the number of alignments of photomasks is reduced, and reduction in yield caused by misalignment with another photomask is suppressed.

Further, by reducing the number of photomasks, a part of photolithography process can be omitted; therefore, manufacturing cost can be reduced and throughput can be improved.

Furthermore, by omitting a part of photolithography process, contamination (e.g., particle) which may be generated in the process can be prevented. Thus, yield and reliability are improved.

An object of the present invention is to reduce the number of photomasks in a manufacturing process of a semiconductor device. That is, by manufacturing a semiconductor device using a process of the present invention, time and cost for the process can be reduced. Although a conventional amorphous silicon TFT is generally manufactured using five photomasks, it is possible to manufacture a TFT using three photomasks or four photomasks, and reduce time and cost for manufacturing the TFT by the present invention.

Further, reliability of elements can be improved by covering the TFT with an insulating film completely. When a surface of a channel portion is exposed, impurities from the substrate and ambient atmosphere, such as boron and phosphorus, enter the channel portion. These may serve as donors, so off leakage current of TFT is increased and an adverse effect that threshold voltage of TFT is changed is expected. However, by covering the TFT with an insulating film completely, that effect can be suppressed. A protective film performs a function of preventing the source electrode and the drain electrode from oxidizing when the TFT is a bottom gate type. On the other hand, the protective film performs a function of preventing the gate electrode from oxidizing when the TFT is a top gate type.

Furthermore, in the present invention, a pixel electrode is positioned below the protective insulating film and a gate insulating film and at a bottom surface of an opening region whereas a conventional pixel electrode is formed in the top layer of stacked layers. Therefore, the gate insulating film and the protective insulating film function as partitions, and interaction of field effects between neighboring pixel electrodes is decreased, thereby suppressing crosstalk. In addition, only the protective film is formed as an interlayer film between the pixel electrode and a signal line conventionally. However, in the present invention, a gate protective film is also provided, so parasitic capacitance between a signal line and a pixel electrode can be reduced.

BRIEF DESCRIPTION OF THE DRAWINGS

FIGS. 1A to 1C are cross-sectional views illustrating a manufacturing method of a TFT substrate according to Embodiment Mode 1.

FIGS. 2A to 2D are cross-sectional views illustrating a manufacturing method of a TFT substrate according to Embodiment Mode 1.

FIGS. 4A to 4C are cross-sectional views illustrating a manufacturing method of a TFT substrate according to Embodiment Mode 1.

FIGS. 5A and 5B are cross-sectional views illustrating a liquid crystal panel according to Embodiment Mode 1.

FIGS. 6A to 6C are cross-sectional views illustrating a manufacturing method of a TFT substrate according to Embodiment Mode 2.

FIGS. 7A and 7B are plan views illustrating a change in a shape of a photoresist in a reflow treatment.

FIGS. 8A to 8C are cross-sectional views illustrating a manufacturing method of a TFT substrate according to Embodiment Mode 3.

FIGS. 9A to 9C are cross-sectional views illustrating a manufacturing method of a TFT substrate according to Embodiment Mode 3.

DETAILED DESCRIPTION OF THE INVENTION

Hereinafter, embodiment modes of the present invention will be described in detail with reference to the accompanying drawings. However, the present invention can be implemented with various modes. It is easily understood by those skilled in the art that the mode and the detail can be variously changed without departing from the scope and spirit of the present invention. Therefore, the present invention should not be interpreted as being limited to the description of the embodiment modes.

Embodiment Mode 1

Figure 11:
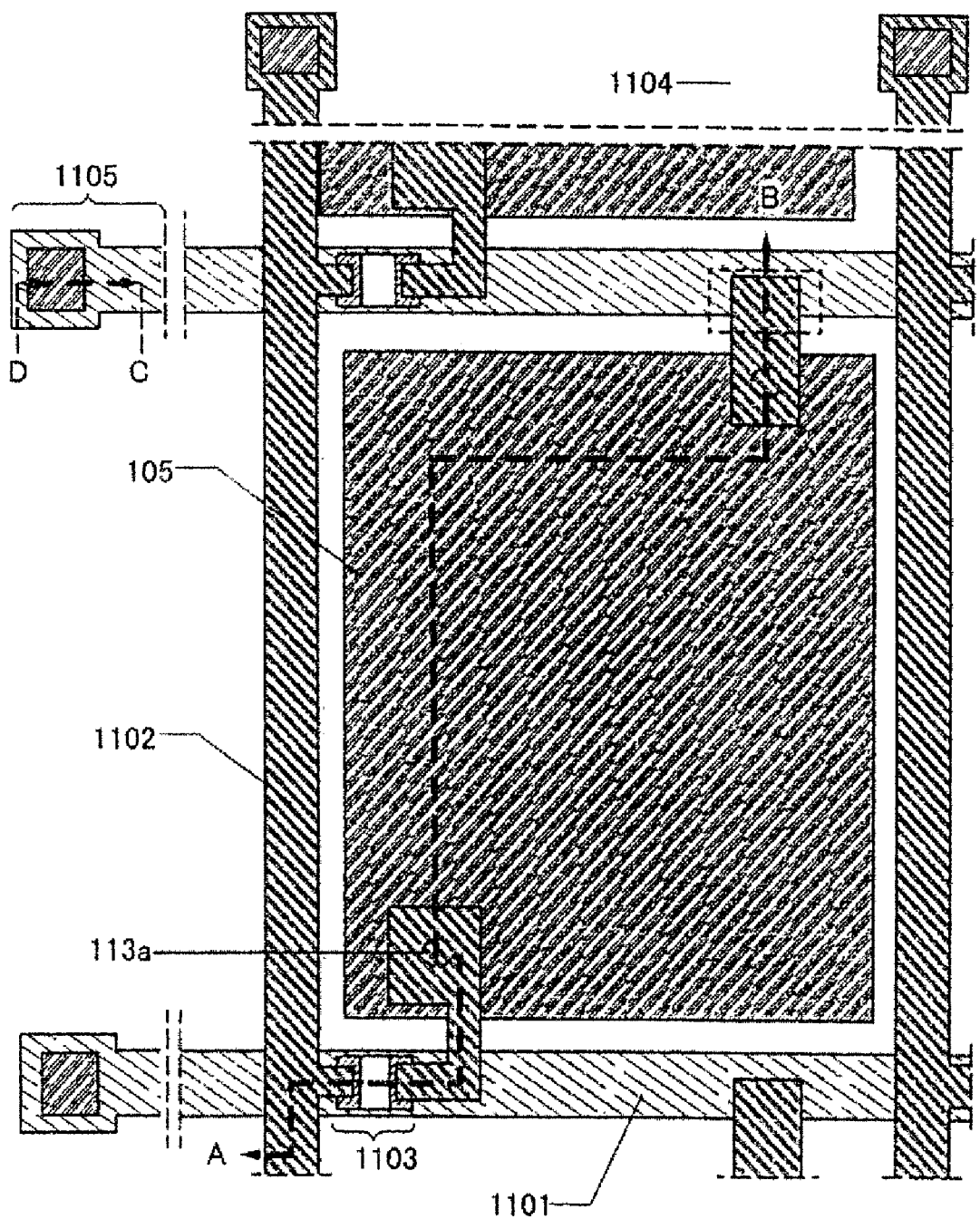
FIG. 11 is a plan view illustrating a TFT substrate according to Embodiment Mode 1.

Description is made using a liquid crystal display device which is one mode of display modes. FIG. 11 is a plan view illustrating a TFT substrate of the liquid crystal display device according to Embodiment Mode 1. A region divided by scan lines 1101 and signal lines 1102 is one pixel, and a region in which a pixel electrode is formed in a pixel is referred to as a pixel region. A TFT 1103 which is a switching element of a pixel is in lower left portion in pixel. An on/off signal of TFT is input from the scan lines 1101 and a video signal is input from the signal lines 1102. The TFT 1103 is electrically connected to a pixel electrode 105 through a contact hole 113a, and the video signal input from the signal line is transmitted to the pixel electrode through the TFT when the TFT is in an on state. A storage capacitor 1104 is formed in upper right portion in pixel. The storage capacitor 1104 has a function that stores the video signal input into the pixel electrode 105 until subsequent signal is input. In FIG. 11, a portion shown by a dotted line A-B corresponds to cross-sectional views of the TFT in the pixel portion of FIGS. 1A to 1C, FIGS. 2A to 2D, FIGS. 3A to 3C, FIGS. 4A to 4C, FIGS. 5A and 5B, and FIGS. 6A to 6C. A substrate 100 has a terminal connection portion 1105 electrically connected to an FPC (flexible printed circuit) in an edge portion of the substrate. A portion shown by a dotted line C-D corresponds to cross-sectional views of the terminal connection portion of FIGS. 1A to 1C, FIGS. 2A to 2D, FIGS. 3A to 3C, FIGS. 4A to 4C, FIGS. 5A and 5B, and FIGS. 6A to 6C.

An inverted staggered TFT of the present invention, which is formed using four photomasks is illustrated in FIGS. 1A to 1C, FIGS. 2A to 2D, FIGS. 3A to 3C, and FIGS. 4A to 4C.

In FIG. 1A, a first conductive layer which includes a transparent conductive layer 101 and a metal layer 102 is stacked over the substrate 100 which is an insulating substrate such as a glass substrate by a sputtering method. This process is performed sequentially, and it is also possible to perform a sequential sputtering using multiple chambers.

Alternatively, since the transparent conductive layer 101 is formed below the metal layer 102 in a structure of the present invention, only the metal layer 102 can be formed by a sputtering method using a commercially available glass substrate provided with ITO.

As for a material of the transparent conductive layer 101, ITO (indium tin oxide) is used. A part of the transparent conductive layer 101 is to be a pixel electrode later. On the other hand, the metal layer 102 is preferably formed using a low resistant metal material such as aluminum since it is to be mainly an electrode or a wiring. Alternatively, a stacked structure with aluminum interposed between barrier layers using refractory metal and in which refractory metal is used as a barrier layer may be employed. For example, the following combination can be considered: the first layer is formed of molybdenum (Mo), the second layer is formed of aluminum (Al), and the third layer is formed of molybdenum (Mo); the first layer is formed of titanium (Ti), the second layer is formed of aluminum (Al), and the third layer is formed of titanium (Ti); the first layer is formed of molybdenum (Mo), the second layer is formed of aluminum (Al) containing a slight amount of neodymium (Nd), and the third layer is formed of molybdenum (Mo); and the like. In this manner, when the metal layer 102 has a stacked structure, formation of a hillock on aluminum can be suppressed.

Note that a silicon oxide film, a silicon nitride film, a silicon oxynitride film, or the like may be formed as a base film between the substrate 100 and the transparent conductive layer 101 although not illustrated in diagrams. By forming the base film, diffusion of mobile ions, impurities, and the like from a glass substrate into an element can be suppressed, which is effective to prevent characteristic deterioration of the element.

In FIG. 1B, a photoresist 103 is formed. Here, the photoresist 103 is formed over the first conductive layer, exposed through a first multi-tone mask 201, and developed.

As for a normal photomask, a pattern is formed of metal over a substrate which transmits light. Therefore, the pattern formed of metal serves as a light blocking portion. In addition, a portion where the pattern formed of metal is not formed serves as a transmissive portion. Note that the normal photomask has the transmittive portion and the light blocking portion. On the other hand, the multi-tone mask has a semi-transmissive portion in addition to them. Methods for forming the semi-transmissive portion are classified into a half-tone light exposure technique and a gray-tone light exposure technique.

A semi transmission is realized using the gray-tone light exposure technique by forming a slit equal to or smaller than the resolution in a transmissive portion, and blocking light partially by the slit. On the other hand, the semi transmission is realized using the half-tone light exposure technique by forming a semi-transmissive film in a semi-transmissive portion. The photoresist exposed through such a multi-tone mask is divided into an exposed portion, a semi-exposed portion, and an unexposed portion. When the semi-exposed portion of the photoresist is developed, the thickness of the photoresist is to be intermediate between the thickness of the exposed portion of the photoresist and the thickness of the unexposed portion of the photoresist.

Note that photoresists can be classified into a positive type and a negative type. If a positive photoresist is used, the exposed portion of the photoresist is removed, and the unexposed portion of the photoresist remains when developed. On the other hand, if a negative photoresist is used, the exposed portion of the photoresist remains, and the unexposed portion of the photoresist is removed. The positive type is preferable in terms of resolution, but it is needless to say that the pattern can be formed even if the negative type is used. Embodiment modes of the present invention are described using the positive photoresist.

The first multi-tone mask 201 includes a light blocking portion 201a and a semi-transmissive portion 201b, and the photoresist 103 which is developed has two different thicknesses. In a portion where the first conductive layer is made to remain, the first multi-tone mask 201 is designed so that the photoresist 103 is thick. On the other hand, in a portion where only the transparent conductive layer 101 is used, the first multi-tone mask 201 is designed so that the photoresist 103b is thin. Here, the photoresist 103a which is thick is formed in portions which are to be a gate electrode, a lower electrode of storage capacitor, and a wiring of terminal connection portion later. On the other hand, the photoresist 103b which is thin is formed in portions which are to be the pixel electrode and the contact hole of the terminal connection portion later.

The first conductive layer is etched using the photoresist 103a and the photoresist 103b as resist masks. Methods for etching are classified into a dry etching method performed in a gas phase and a wet etching method performed in a liquid phase, and either of the methods may be used in this case.

Then, ashing is conducted on the photoresist 103. That is, as shown in FIG. 1C, the photoresist 103a which is formed to be thick is ashed from the surface while covering the region, and remains as a photoresist 104. On the other hand, the photoresist 103b which is formed to be thin is completely removed by this treatment, and the metal layer 102 which is under the photoresist 103b is exposed. In this manner, by using the photoresist 103 formed using the multi-tone mask, the photoresist 104 can be formed without using an additional photomask.

In FIG. 2A, etching is performed using the photoresist 104 as a resist mask to remove the metal layer 102 which is exposed. As a result, the pixel electrode 105 formed of a single layer of the transparent conductive layer 101 is formed in the pixel portion, and a contact hole 106 is formed in the terminal connection portion. Further, an edge portion of the first conductive layer where the photoresist 104 is formed is also etched. This is because the contact area of the photoresist 104 is smaller due to ashing than that of the photoresist 103a, and the edge portion of the first conductive layer is exposed. Accordingly, a part of the metal layer 102, which protrudes from the photoresist 104, is etched at the same time. In this manner, a step shape in which the width of the metal layer 102 is smaller than the width of the transparent conductive layer 101 is formed, and coverage with an insulating layer which is formed later is improved.

In a case where only the metal layer 102 is removed by wet etching whereas the transparent conductive layer 101 is left, an etchant of high selection ratio between the transparent conductive layer and the metal layer is used. In a case where a stacked layer in which the first layer is formed of molybdenum (Mo), the second layer is formed of aluminum (Al), and the third layer is formed of molybdenum (Mo); the first layer is formed of molybdenum (Mo), the second layer is formed of aluminum (Al) containing a slight amount of neodymium (Nd), and the third layer is formed of molybdenum (Mo); or the like is used as the metal layer 102, for example, mixed acid formed of phosphoric acid, nitric acid, acetic acid, and water can be used. Further, if the mixed acid is used, forward tapered shape which is uniform and favorable can be given. In this manner, the wet etching is a simple process in which an etching by an etchant, a rinse by pure water, and drying are performed whereas the throughput is high in addition to an improvement in coverage due to a tapered shape. Thus, a wet etching is suitable for etching of the above metal layer.

In FIG. 2B, the photoresist, which is used, is removed by stripping. By the above process, the pixel electrode 105 formed of a single layer of the transparent conductive layer, the contact hole 106, and a gate electrode 107, a lower electrode 108 of the storage capacitor portion 11, and a wiring of the terminal connection portion 12 formed of the first conductive layer are formed. In addition, a scan line is formed at the same time although it is not shown. The above is a photolithography process using the first multi-tone mask 201.

Then, as illustrated in FIG. 2C, a gate insulating film 109, an i-type semiconductor layer 110, and a semiconductor film having an impurity element which imparts one conductivity type, especially an $n^+$ type semiconductor layer 111, are deposited. The gate insulating film 109 is formed of a silicon nitride film, a silicon oxynitride film, or a stacked film thereof, for example. The i-type semiconductor layer 110 is a non-doped amorphous semiconductor layer to which an impurity imparting a conductivity type is not added, and the $n^+$ type semiconductor layer 111 is an amorphous semiconductor layer to which a pentavalent element, for example, phosphorus (P) or arsenic (As), is added and to which an n-type conductivity is imparted. These are formed by a known CVD method.

Note that the interface between the gate insulating film 109 and the i-type semiconductor layer 110 is needed to be controlled to stabilize the characteristics of TFT. In addition, the interface between the i-type semiconductor layer 110 and the $n^+$ type semiconductor layer 111 is needed to obtain a favorable ohmic contact. Thus, it is preferable that successive film formation from the gate insulating film 109 to the $n^+$ type semiconductor layer 111 are conducted by using a multi-chamber CVD apparatus while maintaining a vacuum state. In a case where the gate insulating film 109 has a stacked structure, successive film formation may be conducted while exposure to the atmosphere from the gate insulating film which is near to the i-type semiconductor layer 110 is not performed.

Then, as illustrated in FIG. 2D, a photoresist 112 which has different thicknesses is formed using a second multi-tone mask 202 which includes a light blocking portion 202a and a semi-transmissive portion 202b. That is, a photoresist 112a which is thick is formed at a portion in which the i-type semiconductor layer 110 and the $n^+$ type semiconductor layer 111 are to be left, whereas a photoresist 112b which is thin is formed at a portion in which these layers are removed and only the gate insulating film 109 is to be left.

Figure 3A:
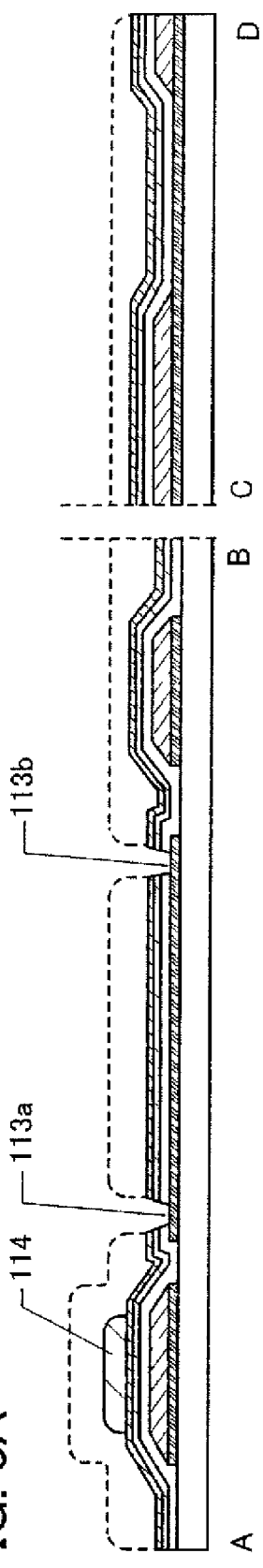
FIGS. 3A to 3C are cross-sectional views illustrating a manufacturing method of a TFT substrate according to Embodiment Mode 1.

Dry etching is performed using the photoresist 112 as a resist mask. As a result, as illustrated in FIG. 3A, portions of the transparent conductive layer 101 which are not covered by the photoresist 112 are exposed, and the contact hole 113a and a contact hole 113b are formed. The contact hole 113a has a function of connecting a pixel TFT to the pixel electrode 105, and the contact hole 113b has a function of connecting the pixel electrode 105 to an upper electrode 120 of the storage capacitor formed later.

Then, the photoresist 112 is ashed, and a photoresist 114 is formed. In this manner, by using a multi-tone mask, the photoresist 114 can be formed without using an additional photomask. The i-type semiconductor layer 110 and the n$^+$ type semiconductor layer 111 are processed using the photoresist 114 as a resist mask. This process can be performed by an RIE type dry etching method using $CF_4$ and $O_2$, or $SF_6$ and $O_2$.

Figure 3B:
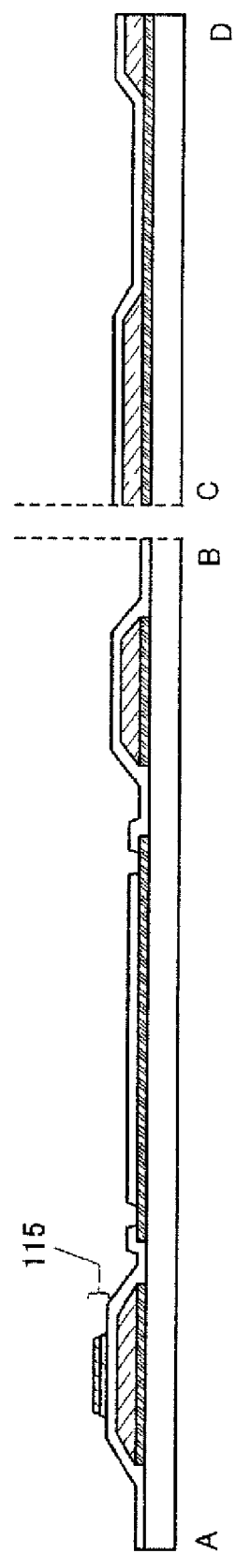

FIG. 3B illustrates that the photoresist 114 is removed by stripping and an island 115 which is an island of the i-type semiconductor layer 110 and the n$^+$ type semiconductor layer 111 is formed. In a case where the semiconductor layer is left on the scan line, it is preferable that unnecessary semiconductor layers are removed in view of reliability of device and industrial applicability because they may lead to current leakage due to light, short circuit between lines, and the like because of a structure of device. The above is a photolithography process using the second multi-tone mask 202.

Figure 3C:
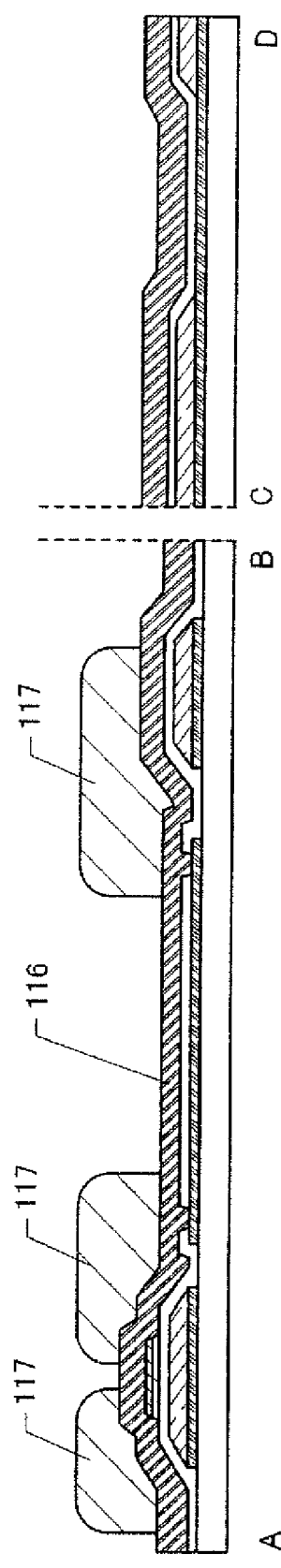

Then, a second conductive layer 116 is formed by a sputtering method, and a photoresist 117 is formed using a third photomask (not shown), which is illustrated in FIG. 3C. FIG. 4A illustrates that the second conductive layer 116 is etched by wet etching using the photoresist 117 as a resist mask. Parts of the second conductive layer 116, which is processed, forms a source electrode 118, a drain electrode 119, and the upper electrode 120 of the storage capacitor. At this time, a signal line is also formed although it is not shown. Note that the second conductive layer 116 is preferably formed using a low resistant metal material such as aluminum since it is to be mainly an electrode or a wiring like the metal layer 102. A stacked structure with aluminum interposed between barrier layers of refractory metal may be employed. For example, the following combination can be considered: the first layer is formed of molybdenum (Mo), the second layer is formed of aluminum (Al), and the third layer is formed of molybdenum (Mo); the first layer is formed of titanium (Ti), the second layer is formed of aluminum (Al), and the third layer is formed of titanium (Ti); the first layer is formed of molybdenum (Mo), the second layer is formed of aluminum (Al) containing a slight amount of neodymium (Nd), and the third layer is formed of molybdenum (Mo); and the like.

Further, the n$^+$ type semiconductor layer 111 is separated by dry etching using the photoresist 117 as a mask. Parts of then type semiconductor layer, which are separated, form a source region 121 and a drain region 122.

When the source electrode 118 and the drain electrode 119 are etched by wet etching in this state, a step shape in which edge portions of the source electrode 118 and the drain electrode 119 are recessed than edge portions of the source region 121 and the drain region 122 is formed. Thus, effects that coverage with a protective insulating film 123 which is described later is improved and unnecessary parasitic capacitance which is generated between the gate electrode 107, and the source electrode 118 and the drain electrode 119 is reduced can be obtained without increasing the number of photomasks. Note that a shape other than a step shape can be formed by dry etching.

After the photoresist 117 which is used is removed by stripping, the protective insulating film 123 is deposited as illustrated in FIG. 4B. The protective insulating film 123 is formed of a silicon nitride film, a silicon oxynitride film, or a stacked film thereof, for example. Then, a photoresist 124 is formed using a fourth photomask (not shown). Etching is performed on the protective insulating film 123 and the gate insulating film 109 using the photoresist 124 as a resist mask. As illustrated in FIG. 4C, the protective insulating film 123 and the gate insulating film 109 are removed, and an opening region 125 which exposes the pixel electrode 105 and a contact hole 126 for an FPC are formed. A layer which attenuates light is not present in the opening region 125, except for an alignment film (not shown) formed later. Therefore, the light transmittance is improved, and high luminance can be achieved.

FIG. 5A is a cross-sectional view of a liquid crystal panel of a vertical electric field type in which voltage is applied perpendicular to a substrate to which a counter substrate is attached. Note that common reference numerals are used for the same portions as those in FIGS. 1A to 1C, FIGS. 2A to 2D, FIGS. 3A to 3C, and FIGS. 4A to 4C. An opposite substrate 500 which is transparent and the substrate 100 over which a TFT is formed are disposed so as to face each other. A black matrix 501 is formed on the counter substrate 500 to shield the pixel TFT and the wiring against light, and to separate the adjacent pixels from each other, thereby preventing an interference of light and reflection of external light. The black matrix 501 is formed of a metal film or a black resin film, and the black resin film is preferable to the metal film because the black resin film does not affect a desired electric field distribution adversely. A color filter 502 is formed separately for each color of red, blue, and green, in a region which is separated by the black matrix 501

In addition, a counter electrode 504 which is formed of a transparent conductive layer is formed so that an electric field is formed between the pixel electrode 105 and the counter electrode 504. A spacer 505 is formed to maintain a space between the substrates. A liquid crystal 510 is interposed between the counter substrate 500 and the substrate 100 over which the TFT is formed, and a sealing material 506 surrounds a periphery of the substrates and attaches a pair of substrates thereby sealing the liquid crystal 510 between the substrates. Further, alignment films (not shown) are formed on surfaces which are in contact with the liquid crystal of the substrates. Here, a planarizing film 503 formed of organic resin is formed between the color filter 502 and the counter electrode 504 so that a space between the counter electrode 504 and the pixel electrode 105 is kept constant, thereby preventing uneven electric field due to unevenness of the electrode from being generated.

A terminal connection portion for an external circuit is formed in an edge portion of the substrate 100 over which the TFT is formed. A wiring 127 for the terminal connection portion which is connected to the pixel TFT can be formed using the first conductive layer. In addition, the contact hole 126 which is formed in the wiring 127 is filled with a resin adhesive 508 containing a conductive particle 507, and is electrically connected to an FPC 509 connecting to an external circuit. Note that the wiring 127 can be also formed as a wiring 128 which uses the second conductive layer as illustrated in FIG. 5B. In both cases, the terminal connection portion can be manufactured using four photomasks.

In this manner, by using the present invention, an active matrix substrate which includes a terminal connection portion connecting to an external circuit can be formed by a four-photomask process. Note that in this embodiment mode, an example of manufacturing a liquid crystal display device of FIG. 5A or 5B by using four photomasks is described, but the present invention can be applied to a manufacturing method of an EL display device in which a light-emitting layer and a counter electrode are stacked over the pixel electrode 105 of FIG. 4C.

Embodiment Mode 2

Then, in FIGS. 6A to 6C and 7A and 7B, a process using three photomasks of the present invention is described. In this process, the steps to the step for forming a source electrode and a drain electrode are similar to the process using four photomasks which is illustrated in FIGS. 1A to 1C, FIGS. 2A to 2D, FIGS. 3A to 3C, and FIGS. 4A to 4C of Embodiment Mode 1; therefore, the description thereof is omitted.

In FIG. 6A, the protective insulating film 123 formed of a silicon nitride film or the like is formed over the entire surface of the substrate by a CVD method. Then, a photoresist 601 is formed over a portion in which the first conductive layer and the second conductive layer are present by exposing process from the back surface of the substrate by backside light exposure. Here, since portions in which the transparent conductive film is formed of a single layer and which are not covered with electrodes formed of the second conductive layer transmit light, it is important that the photoresist is not formed.

In FIG. 6B, by performing heat treatment on the photoresist 601 which is formed by backside light exposure described above to perform a reflow treatment on the photoresist 601, a photoresist 602 in which the edge portion is slightly expanded from the edge portion of the photoresist 601 by width ΔW is formed.

Here, a reflow treatment is a method for changing a shape of the photoresist by performing heat treatment or exposing to the vapor of organic solevant. FIGS. 7A and 7B are plan views illustrating a change in a shape of the photoresist of a pixel TFT portion in a reflow treatment. When a reflow treatment is performed, the photoresist is made to have fluidity and the photoresist which is in a dotted line portion 701 of FIG. 7A is expanded outward to a dotted line portion 702 of FIG. 7B. This expansion reflects the shape of a surface under the photoresist, but it is controlled precisely by a kind of organic solevant, a temperature of vapor of organic solevant, a length of time for exposure to vapor of organic solevant, a temperature of a TFT substrate, and the like.

In FIG. 6C, the gate insulating film 109 and the protective insulating film 123 are processed using the photoresist 602 on which a reflow treatment is performed as a resist mask. In this manner, the pixel electrode 105 formed of a transparent conductive layer is exposed, and an opening region 603 is formed. In addition, since the edge portions of source electrode and drain electrode, and the edge portion of wiring are completely covered with the protective insulating film 123, reliability of element is improved. Thus, by using a backside light exposure and a reflow technique, one photomask can be saved, and a part of the fourth photolithography process can be omitted.

Note that it is needless to say that in a case where this embodiment mode is used, the terminal connection portion connecting to an external terminal can be formed as in Embodiment Mode 1.

In this manner, by using the present invention, an active matrix substrate which includes a terminal connection portion connecting to an external circuit can be formed using three photomasks. Note that in this embodiment mode, the same materials as those used in Embodiment Mode 1 can be used.

Embodiment Mode 3

Figure 12:
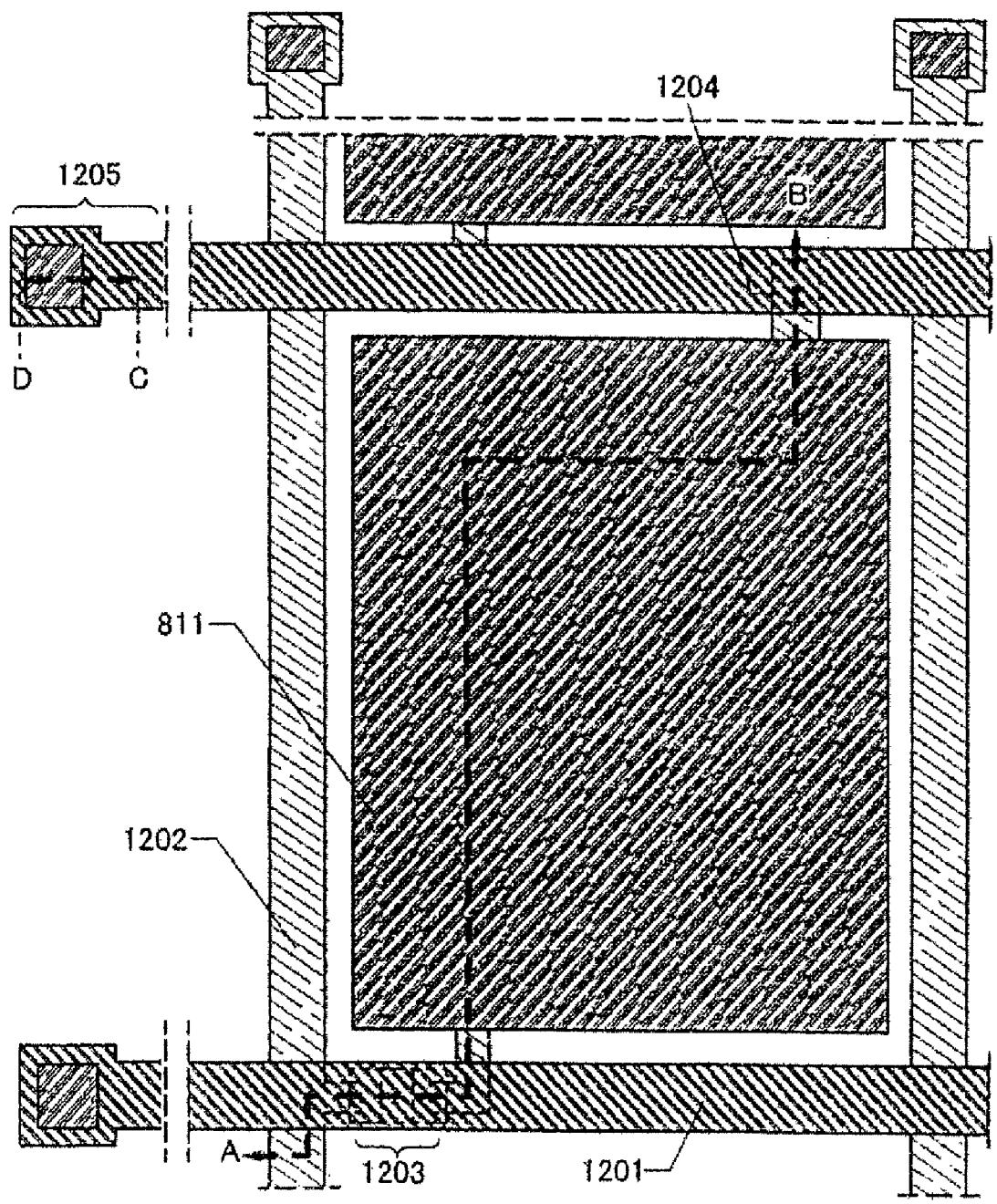
FIG. 12 is a plan view illustrating a TFT substrate according to Embodiment Mode 3.

A process using three photomasks of a top gate type TFT using the present invention is described. FIG. 12 is a plan view illustrating a TFT substrate of a liquid crystal display device according to Embodiment Mode 3. A region divided by scan lines 1201 and signal lines 1202 is one pixel. A TFT 1203 which is a switching element of a pixel is in lower left portion in pixel. An on/off signal of TFT is input from the scan lines 1201 and a video signal is input from the signal lines 1202. The TFT is electrically connected to a pixel electrode 811, and the video signal input from the signal line is transmitted to the pixel electrode through the TFT when the TFT is in an on state. A storage capacitor 1204 is formed in upper right portion in pixel. The storage capacitor 1204 has a function that stores the video signal input into the pixel electrode 811 until subsequent signal is input. In FIG. 12, a portion shown by a dotted line A-B corresponds to cross-sectional views of FIGS. 8A to 8C or FIGS. 9A to 9C. A substrate 803 has a terminal connection portion 1205 electrically connected to an FPC (flexible printed circuit) in an edge portion of the substrate. A portion shown by a dotted line C-D corresponds to cross-sectional views of the terminal connection portion of FIGS. 8A to 8C or FIGS. 9A to 9C.

First, in the same manner as FIG. 1A or FIG. 2B of Embodiment Mode 1, a transparent conductive layer 804 and a metal layer 805, a metal layer 806, and a metal layer 807 are processed using a multi-tone light exposure technique. Then, a semiconductor film having an impurity element which imparts one conductivity type, especially an type semiconductor layer 808, is formed over the transparent conductive layer 804, the metal layer 805, the metal layer 806, and the metal layer 807. Further, a photoresist 809 is left using a backside light exposure technique in only upper portions of the metal layer 805, the metal layer 806, and the metal layer 807 which are processed, and a pixel TFT portion 800, a storage capacitor portion 801, and a terminal connection portion 802 are formed respectively (FIG. 8A). After a reflow treatment of the photoresist, an etching is performed, and the n$^+$ type semiconductor layer 808 is separated into a source region and a drain region (FIG. 8B).

Furthermore, after an i-type semiconductor layer 812 is formed over the entire surface of the substrate, a photoresist 813 is formed only in an upper portion of the pixel electrode using a normal photomask, and the n$^+$ type semiconductor layer 808 and the i-type semiconductor layer 812 are processed to obtain a shape as FIG. 8C. In this process, the n$^+$ type semiconductor layer 808 and the i-type semiconductor layer 812 are processed into an island shape. That is, portions of the n$^+$ type semiconductor layer 808 and the i-type semiconductor layer 812 other than the TFT portions are removed. In a case where the semiconductor layer is left over the signal line and the scan line, it is preferable that the n$^+$ type semiconductor layer 808 and the i-type semiconductor layer 812 are removed in view of reliability of device and industrial applicability because they may lead to current leakage due to light, short circuit between lines, and the like because of a structure of device.

Then, a gate insulating film 814 and a conductive layer 815 are formed. In addition, a photoresist 816 which has two different thicknesses is formed using a multi-tone light exposure technique. In FIG. 9A, a thick photoresist is referred to as a photoresist 816a, and a thin photoresist is referred to as a photoresist 816b. Next, as illustrated in FIG. 9B, ashing is performed, a photoresist 817 is left in the pixel TFT portion 800 and the storage capacitor portion 801, and the photoresist of the terminal connection portion 802 is completely removed in this process.

Thereafter, the conductive layer 815 is etched using the photoresist 817, and a gate electrode 819 is formed. Then, a protective insulating film 818 is formed over the entire surface of the substrate, a photoresist is formed by a backside light exposure, and an opening region is formed by etching after the reflow treatment of the photoresist (FIG. 9C). FIG. 12 shows a top view of the top gate type TFT substrate after the steps up to here are completed. Note that in this embodiment mode, the same materials as those used in Embodiment Mode 1 can be used.

Embodiment Mode 4

Figure 10:
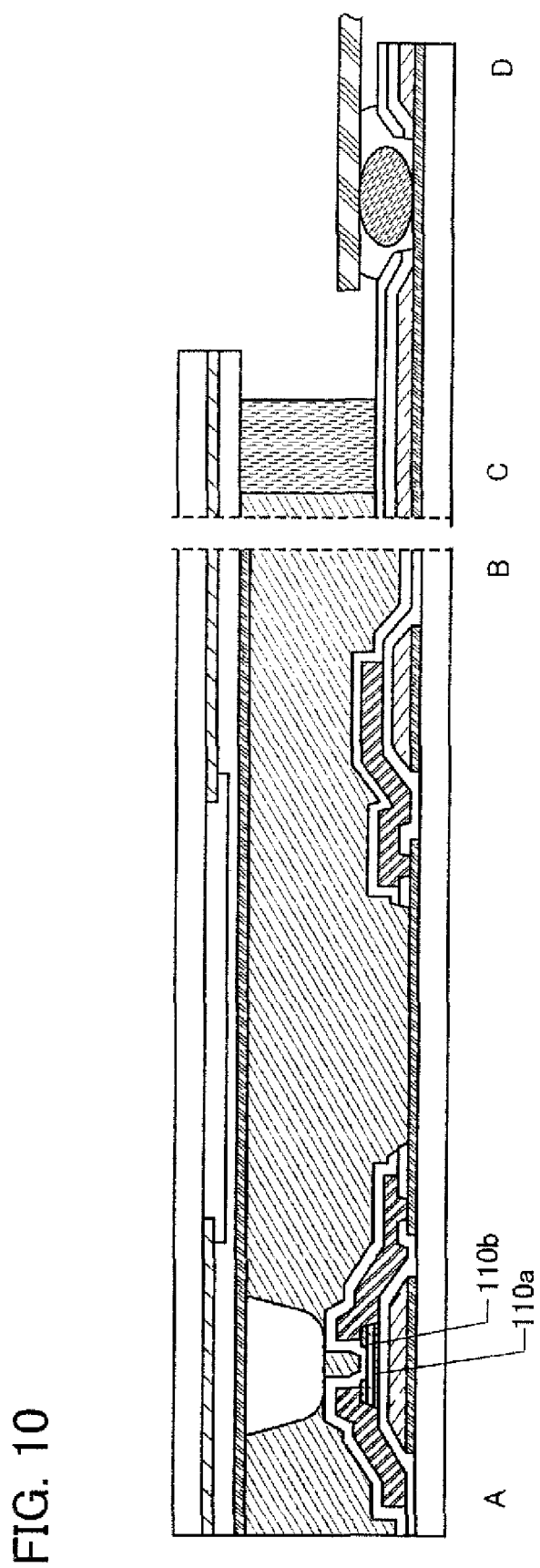
FIG. 10 is a cross-sectional view illustrating a liquid crystal panel according to Embodiment Mode 4.

An example of a TFT using a microcrystalline semiconductor layer is shown in this embodiment mode whereas a TFT using an amorphous semiconductor layer is shown in Embodiment Mode 1. FIG. 10 is a cross-sectional view thereof. In this embodiment mode, the i-type semiconductor layer 110 shown in Embodiment Mode 1 is replaced with a stacked structure in which a microcrystalline semiconductor layer 110a and an amorphous semiconductor layer 110b are stacked. Note that the embodiment mode described here can be applied to any of Embodiment Modes 1 to 3.

The microcrystalline semiconductor layer 110a serves as a channel. The microcrystalline semiconductor layer 110a can be formed by a high-frequency plasma CVD method with a frequency of several tens to several hundreds of megahertz or a microwave plasma CVD apparatus with a frequency of 1 GHz or more. The microcrystalline semiconductor layer 110a can be typically formed using silicon hydride, such as $SiH_4$ or $Si_2H_6$, which is diluted with hydrogen. With a dilution with one or plural kinds of rare gas elements selected from helium, argon, krypton, and neon in addition to silicon hydride and hydrogen, the microcrystalline semiconductor film can be formed. In that case, the flow rate ratio of hydrogen to silicon hydride is set to be 5:1 to 200:1, preferably, 50:1 to 150:1, more preferably, 100:1. Note that, in place of silicon hydride, $SiH_2Cl_2$, $SiHCl_3$, $SiCl_4$, $SiF_4$, or the like can be used. On the other hand, as for the amorphous semiconductor layer 110b, the i-type semiconductor layer 110 shown in Embodiment Mode 1 may be used, which serves as a buffer layer to reduce off current of TFT, prevent oxidation of the microcrystalline semiconductor layer 110a, form the source region or the drain region, and the like.

Alternatively, an $n^+$ type microcrystalline semiconductor layer (not shown) can be used in place of the $n^+$ type semiconductor layer 111 of Embodiment Mode 1. An improvement in on current can be realized because the parasitic resistance between the channel and source electrode or drain electrode can be suppressed.

Embodiment Mode 5

Semiconductor devices and electronic devices according to the present invention include a television, a camera such as a video camera or a digital camera, a goggle-type display (a head mounted display), a navigation system, a sound reproduction system (such as a car audio system, audio components), a notebook personal computer, a game machine, a portable information terminal (such as a mobile computer, a cellular phone, a portable game machine, or an electronic book reader), and an image reproducing device provided with a recording medium (specifically, a system provided with a display that can reproduce content of a recording medium such as a digital versatile disc (DVD) and display the image). Specific examples of those electronic devices are shown in FIGS. 13A to 13D and FIG. 14.

Figure 13A:
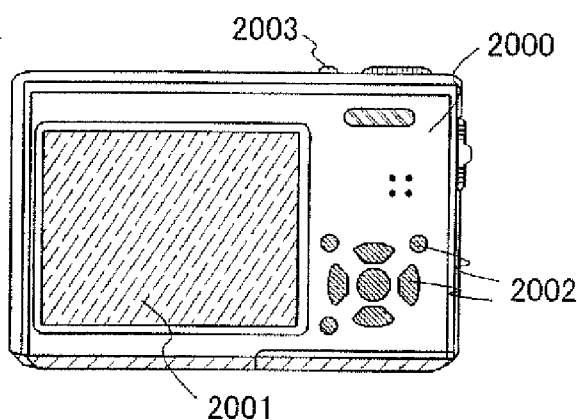
FIGS. 13A to 13D are diagrams each illustrating an example of an electronic device according to Embodiment Mode 5.

FIG. 13A shows a digital camera, which includes a main body 2000, a display portion 2001, an imaging portion, operation keys 2002, a shutter button 2003, and the like. Note that FIG. 13A is a view from the display portion 2001 side and the imaging portion is not shown. A digital camera which has a more inexpensive display portion and high reliability can be realized by the present invention.

Figure 13B:
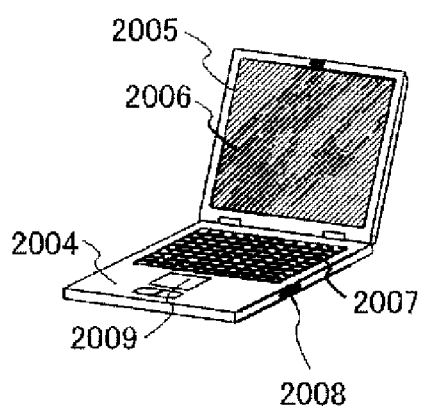

FIG. 13B shows a notebook personal computer, which includes a main body 2004, a housing 2005, a display portion 2006, a keyboard 2007, an external connection portion 2008, a pointing device 2009, and the like. A notebook personal computer which has a more inexpensive display portion and high reliability can be realized by the present invention.

Figure 13C:
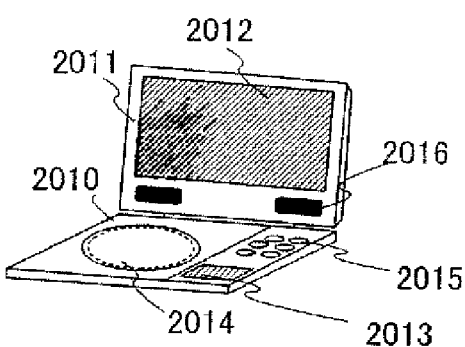

FIG. 13C shows a portable image reproducing device provided with a recording medium (specifically, a DVD reproducing device or the like), which includes a main body 2010, a housing 2011, a display portion A 2012, a display portion B 2013, a recording medium (DVD or the like) reading portion 2014, operation keys 2015, a speaker portion 2016, and the like. The display portion A 2012 mainly displays image data, while the display portion B 2013 mainly displays text data. Note that the image reproducing device provided with the recording medium further includes a home game machine and the like. An image reproducing device which has a more inexpensive display portion and high reliability can be realized by the present invention.

Figure 13D:
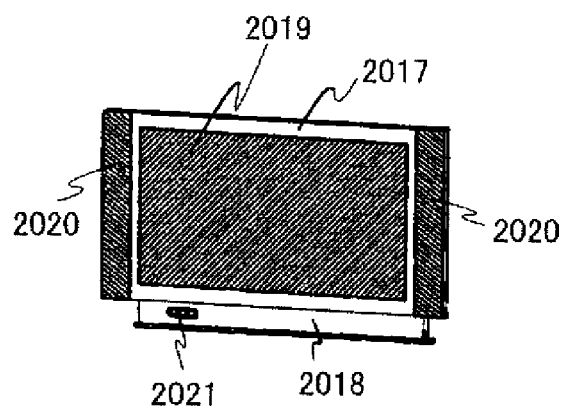

FIG. 13D shows a display device which includes a housing 2017, a support 2018, a display portion 2019, speakers 2020, a video input terminal 2021, and the like. This display device is manufactured using the TFT formed in accordance with the manufacturing method in the embodiment modes described above for the display portion 2019 and a driver circuit. Note that display devices include liquid crystal display devices, light-emitting devices, and the like. Specifically, all types of display devices for displaying information, for example, display devices for computers, display devices for receiving television broadcasting, and display devices for advertisement are included. A large-scale display device especially having a 22-inch to 50-inch large screen which has a more inexpensive display portion and high reliability can be realized by the present invention.

Figure 14:
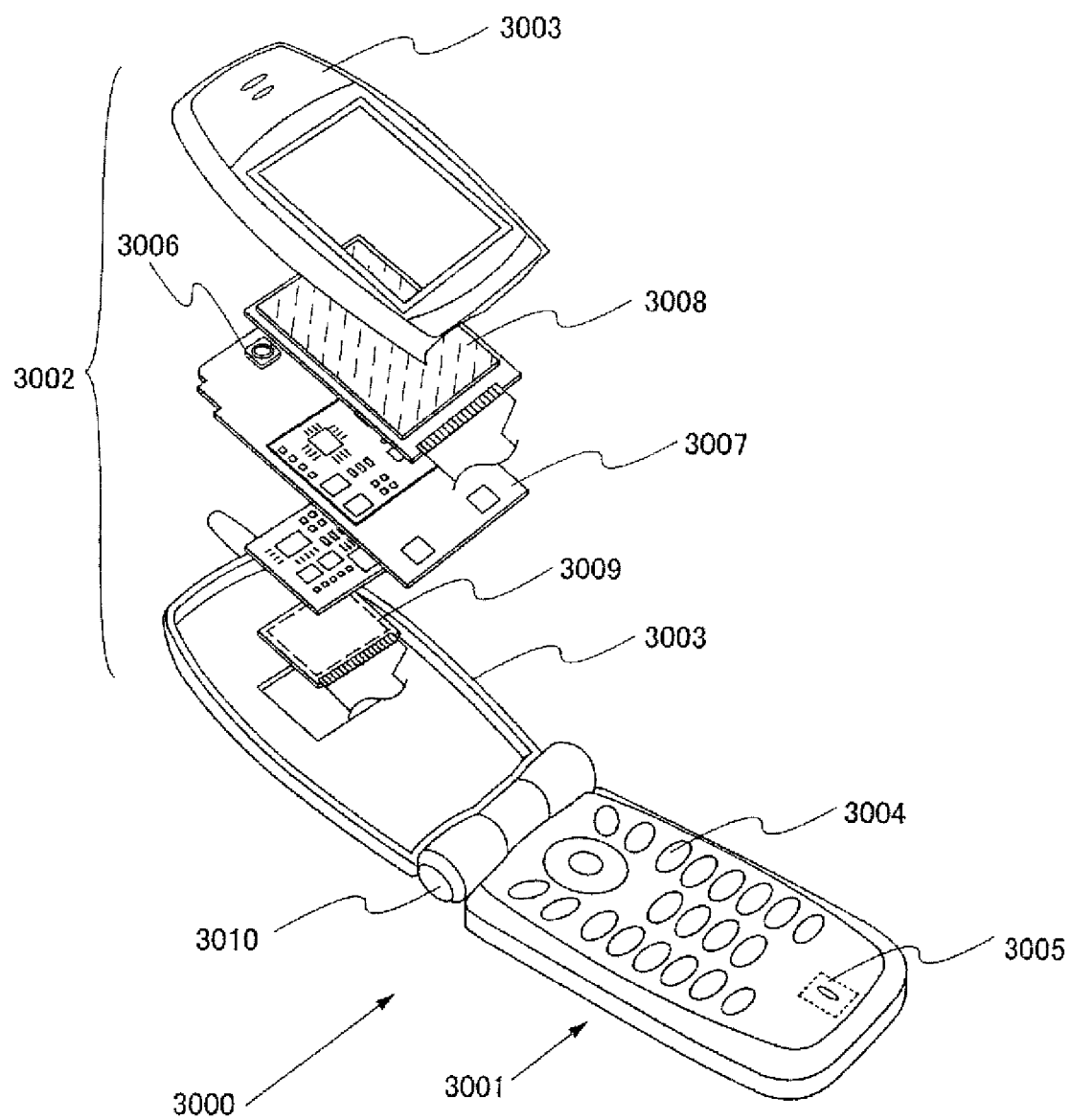
FIG. 14 is a diagram illustrating an example of an electronic device according to Embodiment Mode 5.

A cellular phone 3000 shown in FIG. 14 has a main body (A) 3001 provided with operation switches 3004, a microphone 3005, and the like and a main body (B) 3002 provided with a display panel (A) 3008, a display panel (B) 3009, a speaker 3006, and the like, which are connected with a hinge 3010 so that the cellular phone can be opened or folded. The display panel (A) 3008 and the display panel (B) 3009 are incorporated into a housing 3003 of the main body (B) 3002 together with a circuit board 3007. Pixel portions of the display panel (A) 3008 and the display panel (B) 3009 are arranged so as to be seen from open windows formed in the housing 3003.

The specifications of the display panel (A) 3008 and the display panel (B) 3009 such as the number of pixels can be appropriately set in accordance with the function of the cellular phone 3000. For example, the display panel (A) 3008 and the display panel (B) 3009 can be used in combination so as to be used as a main display screen and a sub-display screen, respectively.

A potable information terminal which has a more inexpensive display portion and high reliability can be realized by the present invention.

The cellular phone 3000 according to this embodiment mode can be changed in various modes in accordance with the functions or applications thereof. For example, by incorporating an imaging element into the hinge 3010, a cellular phone equipped with a camera can be provided. In addition, also in a case where the operation switches 3004, the display panel (A) 3008, and the display panel (B) 3009 are incorporated into one chassis, the effect described above can be obtained. Further, a similar effect can be obtained when the structure of this embodiment mode is applied to an information display terminal provided with a plurality of display portions.

As described above, by carrying out the present invention, that is, by using any one of the manufacturing methods in Embodiment Modes 1 to 4, various electronic devices can be completed.

This application is based on Japanese Patent Application Serial No. 2007-275782 filed with Japan Patent Office on Oct. 23, 2007, the entire contents of which are hereby incorporated by reference.

What is claimed is:

1. A method for manufacturing a semiconductor device, comprising:
   forming a first conductive layer in which a transparent conductive layer and a metal layer are stacked over an insulating substrate;
   forming a first resist using a first multi-tone mask;
   etching the transparent conductive layer and the metal layer using the first resist to form a source electrode, a drain electrode, and a pixel region to be a pixel electrode;
   ashing the first resist so that a part of the first resist is left over the source electrode and the drain electrode;
   etching the metal layer over the pixel region using the first resist which is left to form the pixel electrode formed of the transparent conductive layer;
   forming a semiconductor layer having an impurity element which imparts one conductivity type over the insulating substrate;
   forming a second resist over the source electrode and the drain electrode by backside light exposure and changing a shape of the second resist to cover edge portions of the source electrode and the drain electrode by performing a reflow treatment on the second resist;
   etching the semiconductor layer having an impurity element which imparts one conductivity type using the second resist;
   forming a semiconductor layer over the insulating substrate;
   forming a third resist using a second mask;
   etching the semiconductor layer having an impurity element which imparts one conductivity type and the semiconductor layer using the third resist to exist between the source electrode and the drain electrode and over the source electrode and the drain electrode;
   forming a gate insulating film and a conductive film over the insulating substrate;
   forming a fourth resist using a third multi-tone mask;
   etching the gate insulating film and the conductive film using the fourth resist to form an island-shaped conductive film;
   ashing the fourth resist so that a part of the fourth resist is left over the semiconductor layer;
   etching the island-shaped conductive film using the fourth resist which is left to form a gate electrode;
   forming a protective film over the insulating substrate;
   forming a fifth resist over the gate electrode, the source electrode, and the drain electrode by backside light exposure;
   changing a shape of the fifth resist to cover the gate insulating film by performing a reflow treatment on the fifth resist; and
   etching the protective film over the pixel electrode using the fifth resist.

2. The method for manufacturing a semiconductor device according to claim 1,
   wherein a storage capacitor connected to the pixel electrode is included, an upper electrode of the storage capacitor is formed with a same material as a material of the gate electrode, and a lower electrode of the storage capacitor is formed with a same material as a material of the source electrode and the drain electrode.

3. A method for manufacturing a semiconductor device, comprising:
   forming a first conductive layer in which a transparent conductive layer and a metal layer are stacked over an insulating substrate;
   forming a first resist using a first multi-tone mask;
   etching the transparent conductive layer and the metal layer using the first resist to form a source electrode, a drain electrode, a pixel region to be a pixel electrode, and a terminal connection portion;
   ashing the first resist so that a part of the first resist is left over the source electrode and the drain electrode;
   etching the metal layer over the pixel region using the first resist which is left to form the pixel electrode formed of the transparent conductive layer;
   forming a semiconductor layer having an impurity element which imparts one conductivity type over the insulating substrate;
   forming a second resist over the source electrode and the drain electrode by backside light exposure and changing a shape of the second resist to cover edge portions of the source electrode and the drain electrode by performing a reflow treatment on the second resist;
   etching the semiconductor layer having an impurity element which imparts one conductivity type using the second resist;
   forming a semiconductor layer over the insulating substrate;
   forming a third resist using a second mask;
   etching the semiconductor layer having an impurity element which imparts one conductivity type and the semiconductor layer using the third resist to exist between the source electrode and the drain electrode and over the source electrode and the drain electrode;
   forming a gate insulating film and a conductive film over the insulating substrate;
   forming a fourth resist using a third multi-tone mask;
   etching the gate insulating film and the conductive film using the fourth resist to form an island-shaped conductive film;
   ashing the fourth resist so that a part of the fourth resist is left over the semiconductor layer;
   etching the island-shaped conductive film using the fourth resist which is left to form a gate electrode;
   forming a protective film over the insulating substrate;
   forming a fifth resist over the gate electrode, the source electrode, and the drain electrode by backside light exposure;
   changing a shape of the fifth resist to cover the gate insulating film by performing a reflow treatment on the fifth resist; and
   etching the protective film over the pixel electrode using the fifth resist, wherein the terminal connection portion further comprises a part of the protective film.

4. The method for manufacturing a semiconductor device according to claim 3,
   wherein a storage capacitor connected to the pixel electrode is included, an upper electrode of the storage capacitor is formed with a same material as a material of the gate electrode, and a lower electrode of the storage capacitor is formed with a same material as a material of the source electrode and the drain electrode.

5. A method for manufacturing a liquid crystal display device, comprising:
   forming a first conductive layer in which a transparent conductive layer and a metal layer are stacked over an insulating substrate;
   forming a first resist using a first multi-tone mask;
   etching the transparent conductive layer and the metal layer using the first resist to form a source electrode, a drain electrode, and a pixel region to be a pixel electrode;
   ashing the first resist so that a part of the first resist is left over the source electrode and the drain electrode;
   etching the metal layer over the pixel region using the first resist which is left to form the pixel electrode formed of the transparent conductive layer;
   forming a semiconductor layer having an impurity element which imparts one conductivity type over the insulating substrate;
   forming a second resist over the source electrode and the drain electrode by backside light exposure and changing a shape of the second resist to cover edge portions of the source electrode and the drain electrode by performing a reflow treatment on the second resist;
   etching the semiconductor layer having an impurity element which imparts one conductivity type using the second resist;
   forming a semiconductor layer over the insulating substrate;
   forming a third resist using a second mask;
   etching the semiconductor layer having an impurity element which imparts one conductivity type and the semiconductor layer using the third resist to exist between the source electrode and the drain electrode and over the source electrode and the drain electrode;
   forming a gate insulating film and a conductive film over the insulating substrate;
   forming a fourth resist using a third multi-tone mask;
   etching the gate insulating film and the conductive film using the fourth resist to form an island-shaped conductive film;
   ashing the fourth resist so that a part of the fourth resist is left over the semiconductor layer;
   etching the island-shaped conductive film using the fourth resist which is left to form a gate electrode;
   forming a protective film over the insulating substrate;
   forming a fifth resist over the gate electrode, the source electrode, and the drain electrode by backside light exposure;
   changing a shape of the fifth resist to cover the gate insulating film by performing a reflow treatment on the fifth resist;
   etching the protective film over the pixel electrode using the fifth resist; and forming a liquid crystal layer over the pixel electrode.

6. The method for manufacturing a liquid crystal display device according to claim 5,
   wherein a storage capacitor connected to the pixel electrode is included, an upper electrode of the storage capacitor is formed with a same material as a material of the gate electrode, and a lower electrode of the storage capacitor is formed with a same material as a material of the source electrode and the drain electrode.

* * * * *